United States Patent
Kim et al.

(10) Patent No.: US 8,823,010 B2
(45) Date of Patent: Sep. 2, 2014

(54) THIN-FILM TRANSISTOR ARRAY SUBSTRATE AND DISPLAY DEVICE INCLUDING THE SAME

(71) Applicants: Hwa-Jeong Kim, Yongin (KR); Chi-Wook An, Yongin (KR)

(72) Inventors: Hwa-Jeong Kim, Yongin (KR); Chi-Wook An, Yongin (KR)

(73) Assignee: Samsung Display Co., Ltd., Yongin, Gyunggi-Do (KR)

( * ) Notice: Subject to any disclaimer, the term of this patent is extended or adjusted under 35 U.S.C. 154(b) by 0 days.

(21) Appl. No.: 13/798,686

(22) Filed: Mar. 13, 2013

(65) Prior Publication Data

US 2014/0061606 A1    Mar. 6, 2014

(30) Foreign Application Priority Data

Aug. 31, 2012  (KR) .......................... 10-2012-0096793

(51) Int. Cl.
*H01L 27/15*    (2006.01)
*H01L 23/48*    (2006.01)

(52) U.S. Cl.
CPC ................ *H01L 23/48* (2013.01); *H01L 27/15* (2013.01)
USPC .......................................... 257/72; 257/776

(58) Field of Classification Search
CPC .................... H01L 51/0508; H01L 29/66742; H01L 23/66742; H01L 23/48; H01L 27/15
USPC ..................................................... 257/72, 776
See application file for complete search history.

(56) References Cited

U.S. PATENT DOCUMENTS

| | | | |
|---|---|---|---|
| 7,548,023 B2* | 6/2009 | Yamazaki et al. | 313/512 |
| 2006/0102900 A1* | 5/2006 | Shin et al. | 257/59 |
| 2008/0035930 A1* | 2/2008 | Nishiura et al. | 257/72 |
| 2011/0090438 A1* | 4/2011 | Lee | 349/110 |
| 2012/0080663 A1* | 4/2012 | Lee et al. | 257/40 |
| 2014/0054562 A1* | 2/2014 | Lee | 257/40 |

FOREIGN PATENT DOCUMENTS

| | | |
|---|---|---|
| KR | 10 1999-0056811 A | 7/1999 |
| KR | 10 2006-0063299 A | 6/2006 |
| KR | 10 2011-0056899 A | 5/2011 |

* cited by examiner

*Primary Examiner* — W. Wendy Kuo
*Assistant Examiner* — Herve Assouman
(74) *Attorney, Agent, or Firm* — Lee & Morse, P.C.

(57) ABSTRACT

A thin-film transistor (TFT) array substrate includes a first conductive layer of a TFT, a second conductive layer that partially overlaps the first conductive layer, a through hole in a layer between the first and second conductive layers, a node contact hole integrally formed to include a first contact hole in the first conductive layer and a second contact hole in the second conductive layer such that the first contact hole is continuous with the second contact hole and is not separated from the second contact hole by an insulation layer, and a connection node that is in another layer different from the first conductive layer and the second conductive layer. The connection node is connected to the first and second conductive layers through the through hole and the node contact hole.

28 Claims, 9 Drawing Sheets

THIN-FILM TRANSISTOR ARRAY SUBSTRATE AND DISPLAY DEVICE INCLUDING THE SAME

CROSS-REFERENCE TO RELATED APPLICATION

This application claims the benefit of Korean Patent Application No. 10-2012-0096793, filed on Aug. 31, 2012, in the Korean Intellectual Property Office, the disclosure of which is incorporated herein in its entirety by reference.

BACKGROUND

A display device, such as an organic light-emitting display device and a liquid crystal display device, may include a thin-film transistor (TFT), a capacitor, and wires connecting the TFT and the capacitor. The display device may be manufactured by forming a minute pattern of a TFT, a capacitor, and wires on a substrate, and the display device may operate by a complex connection between the TFT, the capacitor, and wires. As demand for compact and high resolution display has increased, an efficient space arrangement and connection structure between the TFT, the capacitor, and wires included in the display device are sought.

SUMMARY

Embodiments may be realized by providing a thin-film transistor (TFT) array substrate including a first conductive layer selected from an active layer, a gate electrode, a source electrode, and a drain electrode included in a TFT, a second conductive layer partially overlapping with the first conductive layer and disposed in a layer different from the first conductive layer, a through hole formed in a layer disposed above between the first conductive layer and the second conductive layer in a region in which the first conductive layer and the second conductive layer overlap, a node contact hole formed by not separating a first contact hole formed in the first conductive layer and a second contact hole formed in the second conductive layer by an insulation layer but by integrally forming the first contact hole and the second contact hole, and a connection node disposed in a layer different from the first conductive layer and the second conductive layer and connected to the first conductive layer and the second conductive layer through the through hole and the node contact hole.

The through hole and the node may contact hole at least partially overlap. A size of the through hole may be smaller than the size of the node contact hole. No bank may be formed by the insulation layer between the first contact hole and the second contact hole.

One of the first conductive layer and the second conductive layer may be formed in the same layer as the active layer. One of the first conductive layer and the second conductive layer may be formed of the same material as the active layer.

The insulation layer may include a first insulation layer formed between the first conductive layer and the second conductive layer and a second insulation layer formed between the upper one of the first conductive layer and the second conductive layer and the connection node. The second insulation layer may not be formed in a region in which the first conductive layer and the second conductive layer partially overlap in a region in which the node contact hole is formed.

Embodiments may also be realized by providing a display apparatus that includes a plurality of pixels including at least one TFT and at least one capacitor, a pixel circuit connected to a plurality of wires, and a display device connected to the pixel circuit, a first conductive layer disposed in the plurality of pixels and selected from an active layer, a gate electrode, a source electrode, and a drain electrode included in a TFT, a second conductive layer disposed in the plurality of pixels, partially overlapping with the first conductive layer and disposed in a layer different from the first conductive layer, a through hole formed in a layer disposed above between the first conductive layer and the second conductive layer in a region in which the first conductive layer and the second conductive layer overlap, a node contact hole formed by not separating a first contact hole formed in the first conductive layer and a second contact hole formed in the second conductive layer by an insulation layer but by integrally forming the first contact hole and the second contact hole, and a connection node disposed in a layer different from the first conductive layer and the second conductive layer and connected to the first conductive layer and the second conductive layer through the through hole and the node contact hole.

The through hole and the node contact hole at least may partially overlap. A size of the through hole may be smaller than the size of the node contact hole. No bank may be formed by the insulation layer between the first contact hole and the second contact hole.

The second conductive layer may be an electrode of the capacitor. The second conductive layer may be a layer extending from the plurality of wires. The connection node may be formed on the same layer as a data wire among the plurality of wires that provides the pixel circuit with a data signal.

One of the first conductive layer and the second conductive layer may be formed in the same layer as the active layer. One of the first conductive layer and the second conductive layer may be formed of the same material as the active layer. One of the first conductive layer and the second conductive layer may include doped polysilicon.

The insulation layer may include a first insulation layer formed between the first conductive layer and the second conductive layer and a second insulation layer formed between the upper one of the first conductive layer and the second conductive layer and the connection node. The second insulation layer may not be formed in a region in which the first conductive layer and the second conductive layer partially overlap in a region in which the node contact hole is formed.

The display device may be an organic light-emitting device (OLED) including a first electrode, a second electrode, and an emissive layer disposed between the first electrode and the second electrode. A planarization layer may be formed between the OLED and the connection node.

Embodiments may also be realized by providing a display apparatus that includes a plurality of pixels including at least one TFT and at least one capacitor, a pixel circuit connected to a plurality of wires, and a display device connected to the pixel circuit; a first conductive layer disposed in the plurality of pixels, a second conductive layer disposed in the plurality of pixels, partially overlapping with the first conductive layer and disposed in a layer different from the first conductive layer, a through hole formed in a layer disposed above between the first conductive layer and the second conductive layer in a region in which the first conductive layer and the second conductive layer overlap, a node contact hole formed by not separating a first contact hole formed in the first conductive layer and a second contact hole formed in the second conductive layer by an insulation layer but by integrally forming the first contact hole and the second contact hole, and a connection node disposed in a layer different from the first conductive layer and the second conductive layer and connected to the first conductive layer and the second conductive layer through the through hole and the node contact hole.

The first conductive layer may be selected from an active layer, a gate electrode, a source electrode, and a drain electrode included in the at least one TFT. The through hole and the node may contact hole at least partially overlap. A size of the through hole may be smaller than the size of the node contact hole.

The display device may be an OLED including a first electrode, a second electrode, and an emissive layer disposed between the first electrode and the second electrode. A planarization layer may be formed between the OLED and the connection node.

BRIEF DESCRIPTION OF THE DRAWINGS

Features will become more apparent by describing in detail exemplary embodiments thereof with reference to the attached drawings in which.

DETAILED DESCRIPTION

Figure 1:
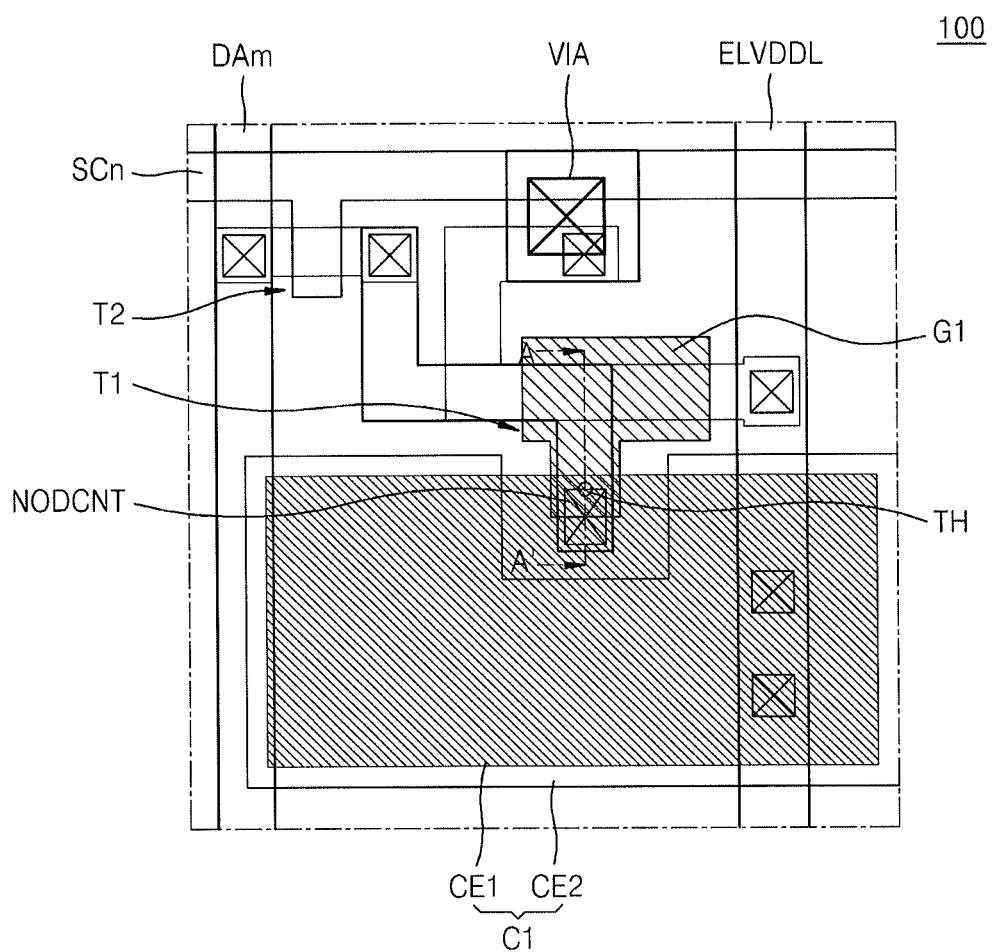
FIG. 1 is a schematic cross-sectional view of a pixel of an organic light-emitting display device according to an exemplary embodiment.

In the following detailed description, only certain exemplary embodiments have been shown and described, simply by way of illustration. As those skilled in the art would realize, the described embodiments may be modified in various different ways, all without departing from the spirit or scope of the embodiments.

Accordingly, the drawings and description are to be regarded as illustrative in nature and not restrictive. Like reference numerals designate like elements throughout the specification.

In various embodiments, the elements having the same construction are representatively described in a first embodiment by using the same reference numeral, and constructions different from that described in the first embodiment are described in the other embodiments.

Sizes and thicknesses of the elements shown in the drawings are for the purpose of descriptive convenience, and thus embodiments are not necessarily limited thereto. Thicknesses of layers and regions are expanded in the drawings for clarity. For descriptive convenience, thicknesses of some layers and regions are exaggerated in the drawings. When an element such as a layer, a film, a region, and a board is referred to as being "on" another element, the element can be directly on another element or intervening elements.

Throughout this specification, unless explicitly described to the contrary, the words "include" and "comprise" and variations such as "includes," "comprises," and "comprising," will be understood to imply the inclusion of stated elements but not the exclusion of any other elements. Further, throughout this specification, the term "above" encompasses both an orientation of above and below and does not necessarily encompass the orientation of above with respect to a direction of gravity.

Although an active matrix (AM) organic light-emitting display device having a 2Tr-1Cap structure including two thin film transistors (TFTs) and one capacitor in a single pixel, and an AM organic light-emitting display device having a 6Tr-sCap structure including six TFTs and two capacitors, are illustrated in the accompanying drawings, the embodiments are not limited thereto. Thus, the organic light-emitting display device may have a plurality of TFTs and one or more capacitors in a single pixel and may have a variety of structures in which wires are additionally formed or existing wires are omitted. In this regard, a pixel refers to a minimum unit used to display an image. The organic light-emitting display device displays an image through a plurality of pixels.

The organic light-emitting display device according to a first exemplary embodiment will now be described with reference to FIGS. 1 through 4.

Figure 2:
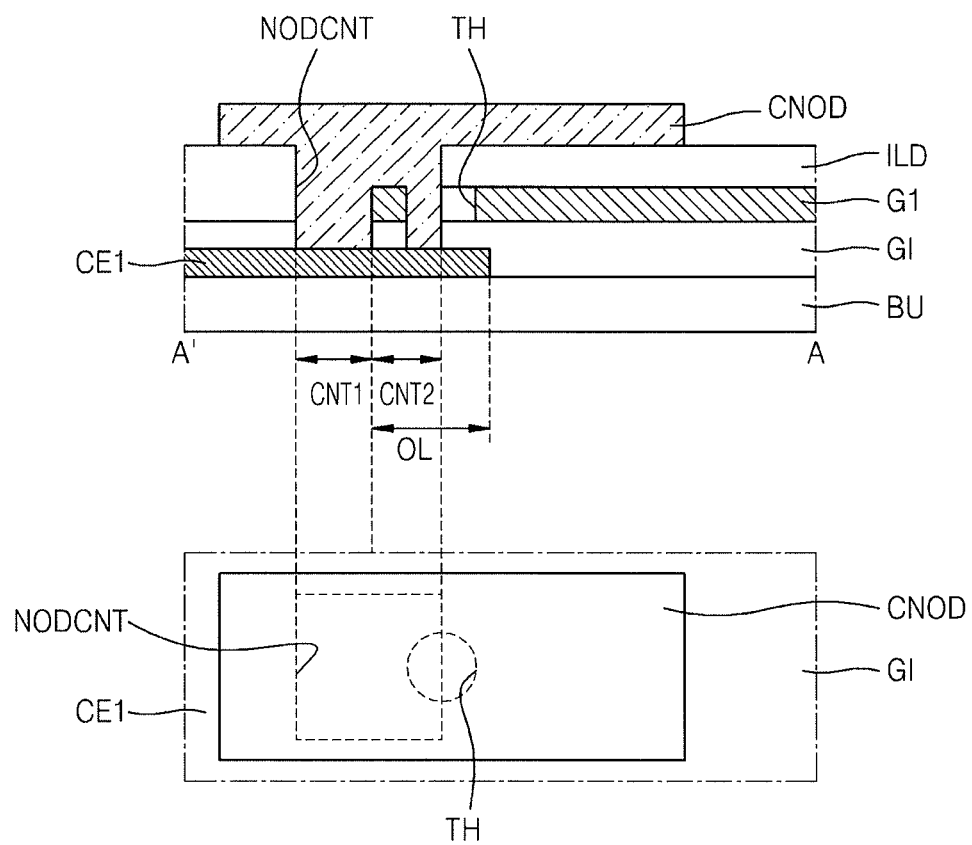
FIG. 2 is a schematic cross-sectional and plan view of a part A-A' of FIG. 1.
Figure 3:
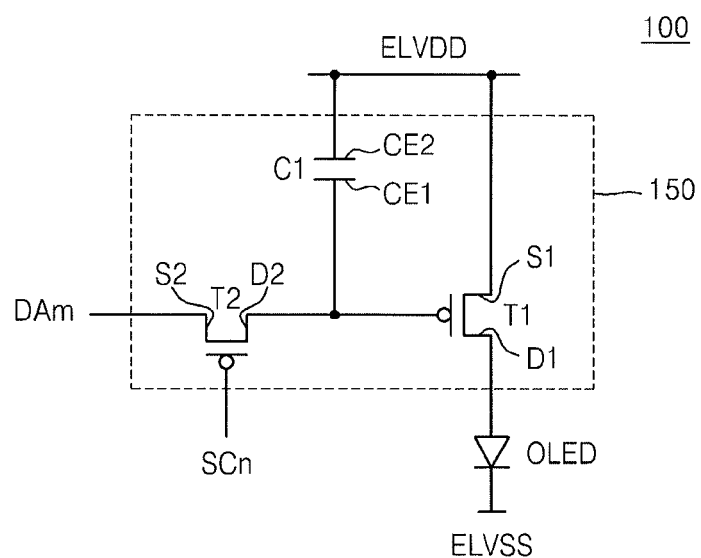
FIG. 3 is a circuit diagram of the pixel of FIG. 1.
Figure 4:
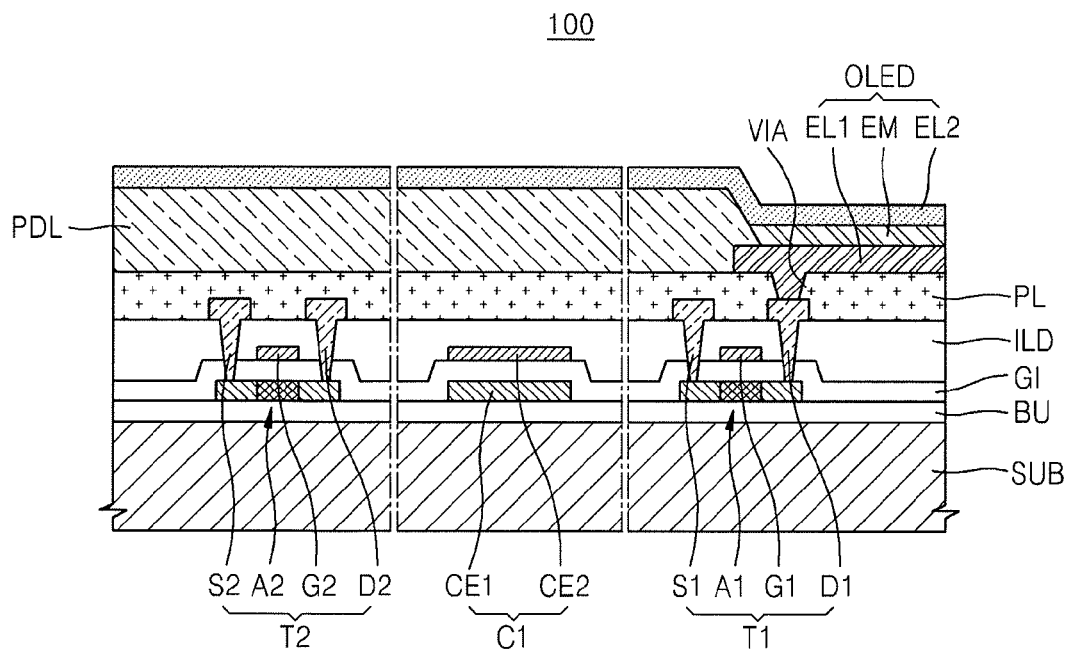
FIG. 4 is a cross-sectional diagram of the pixel of FIG. 1.

FIG. 1 is a schematic cross-sectional view of a pixel 100 of an organic light-emitting display device according to the first exemplary embodiment. FIG. 2 is a schematic cross-sectional and plan view of a part A-A' of FIG. 1. FIG. 3 is a circuit diagram of the pixel 100 of FIG. 1. FIG. 4 is a cross-sectional diagram of the pixel 100 of FIG. 1.

As shown in FIGS. 1 through 4, the pixel 100 of the organic light-emitting display device according to the first exemplary embodiment includes two TFTs and one capacitor.

The pixel 100 includes an organic light-emitting device (OLED) that is connected between a first power source ELVDD and a second power source ELVSS and a pixel circuit 150 that is connected between the first power source ELVDD and the OLED and controls driving power supplied to the OLED.

An anode electrode EL1 of the OLED is connected to a driving power line ELVDDL connected to the first power source ELVDD via the pixel circuit 150, and a cathode electrode EL2 thereof is connected to the second power source ELVSS. The OLED emits light at brightness corresponding to a driving current that flows through the OLED when the driving power is supplied from the first power source ELVDD through the pixel circuit 150 and common power is supplied from the second power source ELVSS.

The pixel circuit 150 includes a first TFT T1, a second TFT T2, and a first capacitor C1.

The first TFT T1 is connected between the driving power line ELVDDL and the OLED and supplies the driving power corresponding to a data signal from the first power source ELVDD to the OLED during a light emitting period of the pixel 100. That is, the first TFT T1 functions as a driving transistor of the pixel 100. The first TFT T1 includes a first active layer A1, a first gate electrode G1, a first source electrode S1, and a first drain electrode D1.

The first active layer A1 may include polysilicon, a source region and a drain region that are doped with a doping material, and a channel region disposed between the source region and the drain region. The first active layer A1 is disposed between a buffer layer BU and a gate insulation layer G1 that are formed in a substrate SUB.

The first gate electrode G1 is disposed between the gate insulation layer G1 and an interlayer insulation layer ILD. The first gate electrode G1 includes a region OL that overlaps with a part of a first capacitor electrode CE1 of the first capacitor C1 that will be described later. A through hole TH is formed in the region OL of the first gate electrode G1. The first gate electrode G1 is connected to the first capacitor electrode CE1 of the first capacitor C1 through a connection node CNOD formed in the through hole TH and the node contact hole NODCNT.

The first source electrode S1 is connected to the driving power line ELVDDL.

The first drain electrode D1 is connected to the anode electrode EL1 of the OLED.

The second TFT T2 is connected between a data line DAm and the first TFT T1, and transfers a data signal provided from the data line DAm to the inside of the pixel 100 when a scan signal is provided from a scan line SCn. That is, the second TFT T2 functions as a switching transistor of the pixel 100. The second TFT T2 includes a second active layer A2, a second gate electrode G2, a second source electrode S2, and a second drain electrode D2.

The second active layer A2 may include polysilicon, a source region and a drain region that are doped with a doping material, and a channel region disposed between the source region and the drain region. The second active layer A2 is disposed between the buffer layer BU and the gate insulation layer G1 that are formed in the substrate SUB.

The second gate electrode G2 is connected to the scan line SCn and is disposed on the same layer as a layer on which the first gate electrode G1 and the scan line SCn are disposed. That is, the gate insulation layer G1 is disposed between the second gate electrode G2 and the second active layer A2.

The second source electrode S2 is connected to the data line DAm. The second drain electrode D2 is connected to the first gate electrode G1 of the first TFT T1.

Although the first source drain S1 and the first drain electrode D1 of the first TFT T1 and the second source drain S2 and the second drain electrode D2 of the second TFT T2 of the organic light-emitting display device are formed in different layers from the first active layer A1 and the second active layer A2, respectively, in FIG. 4, the embodiments are not limited thereto. For example, the first source drain S1 and the first drain electrode D1 of the first TFT T1, and the second source drain S2 and the second drain electrode D2 of the second TFT T2, of an organic light-emitting display device according to another exemplary embodiment may be selectively formed in the same layers as the first active layer A1 and the second active layer A2, respectively.

The first capacitor C1 is used to store the data signal provided to the inside of the pixel 100 during a data programming period, to maintain the data signal for a frame, and is connected to the first power ELVDD and the first gate electrode G1 of the first TFT T1. That is, the first capacitor C1 functions as a storage capacitor. The first capacitor C1 includes the first capacitor electrode CE1 and a second capacitor electrode CE2.

The first capacitor electrode CE1 is connected to the above-described first gate electrode G1 of the first TFT T1 through the connection node CNOD formed in the through hole TH and the node contact hole NODCNT. The first capacitor electrode CE1 is disposed on the same layer as the first active layer A1 and the second active layer A2. That is, the first capacitor electrode CE1 may be formed of polysilicon doped with a doping material.

The second capacitor electrode CE2 is connected to the driving power line ELVDDL.

The first drain electrode D1 of the first TFT T1 is connected to the OLED through a via hole VIA.

The OLED includes the anode electrode EL1 disposed on the first drain electrode D1 with a planarization layer PL interposed therebetween and connected to the first drain electrode D1, an emissive layer EL, and the cathode electrode E2 connected to the second power source ELVSS. A location of the emissive layer EL may be determined by a pixel definition layer PDL. The cathode electrode EL2 may be disposed throughout the pixel definition layer PDL.

Referring to FIGS. 1 and 2, the gate insulation layer G1 is formed between the first capacitor electrode CE1 of the first capacitor C1 and the first gate electrode G1 of the first TFT T1. The interlayer insulation layer ILD is formed between the first gate electrode G1 of the first TFT T1 and the connection node CNOD.

The first capacitor electrode CE1 of the first capacitor C1 is connected to the connection node CNOD through a first contact hole CNT1 formed in the gate insulation layer G1 and the interlayer insulation layer ILD. In addition, the first capacitor electrode CE1 is connected to the connection node CNOD through the through hole TH formed in the first gate electrode G1. The first gate electrode G1 of the first TFT T1 is connected to the connection node CNOD through a second contact hole CNT2 formed in the interlayer insulation layer ILD. That is, although the first capacitor electrode CE1 of the first capacitor C1 and the first gate electrode G1 of the first TFT T1 are formed in different layers, they are connected to the same connection node CNOD through the through hole TH and the node contact hole NODCNT.

In this regard, the first contact hole CNT1 and the second contact hole CNT2 are not separated from each other by the gate insulation layer G1 or the interlayer insulation layer ILD but form the one united node contact hole NODCNT. That is, the node contact hole NODCNT is integrally formed without a bank by the gate insulation layer G1 or the interlayer insulation layer ILD.

The first capacitor electrode CE1 and the first gate electrode G1 include the partially overlapping region OL in the region where the node contact hole NODCNT is formed. The interlayer insulation layer ILD is not formed in the partially overlapping region OL. The node contact hole NODCNT and the through hole TH partially overlap and are formed in the first gate electrode G1 of the partially overlapping region OL.

If the first contact hole CNT1 and the second contact hole CNT2 are separated to form the node contact hole NODCNT, an insulation layer needs to be formed as a bank between the first contact hole CNT1 and the second contact hole CNT2. However, since the first contact hole CNT1 and the second contact hole CNT2 according to exemplary embodiments are not separated from each other but are integrally formed, no bank is necessarily formed between the first contact hole CNT1 and the second contact hole CNT2, which reduces a design margin for forming the bank when a pixel is designed, thereby maximizing a space utilization. Such reduced space may be used to increase an area of a capacitor, thereby implementing a high resolution pixel design.

Even when the first contact hole CNT1 and the second contact hole CNT2 are not separated from each other but are integrally formed, a contact failure may occur between the first gate electrode G1 and the node contact hole NODCNT, e.g., due to a processing error or misalignment that occurs when the first gate electrode G1 and the node contact hole NODCNT are formed. However, although the processing error or misalignment occurs when the first gate electrode G1 or the node contact hole NODCNT is formed by forming the through hole TH in the first gate electrode G1 in the present embodiment, since the first gate electrode G1 and the first capacitor electrode CE1 are connected to each other through the through hole TH, the possibility of a contact failure occurring may be reduced so that the resultant structure may be improved.

Figure 5:
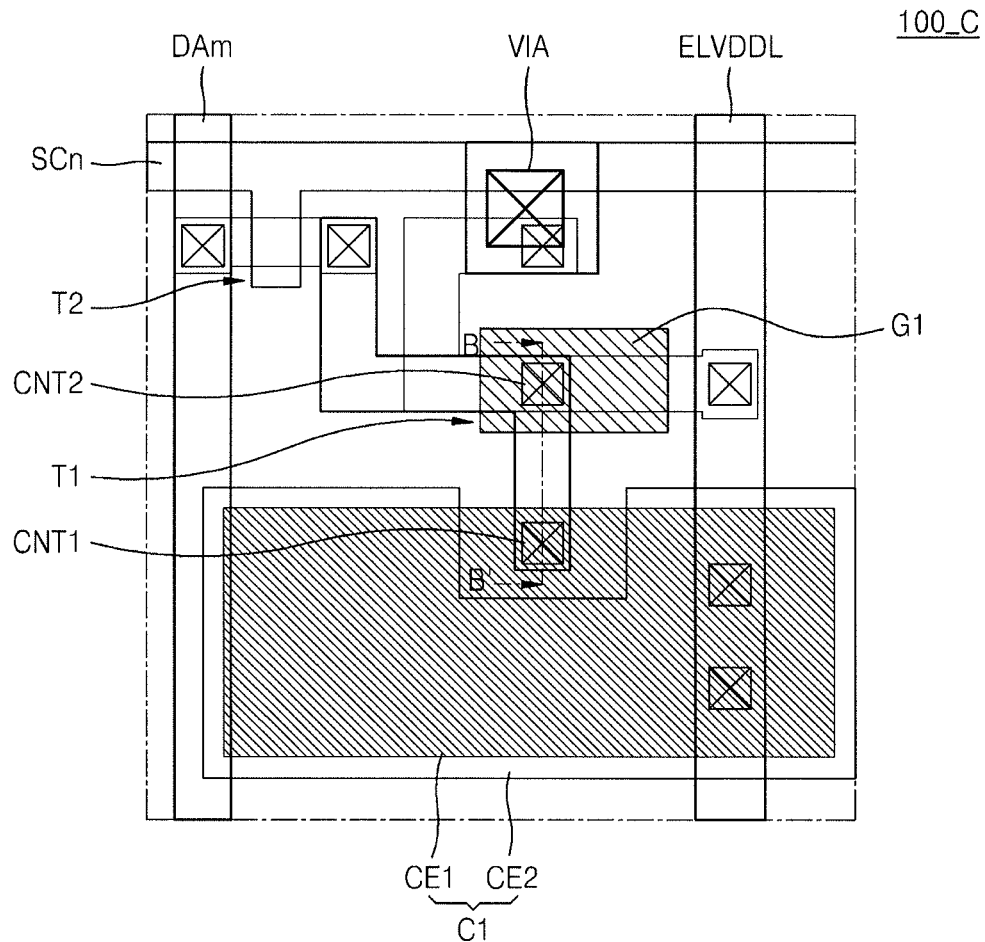
FIG. 5 is a schematic cross-sectional view of a pixel of an organic light-emitting display device.
Figure 6:
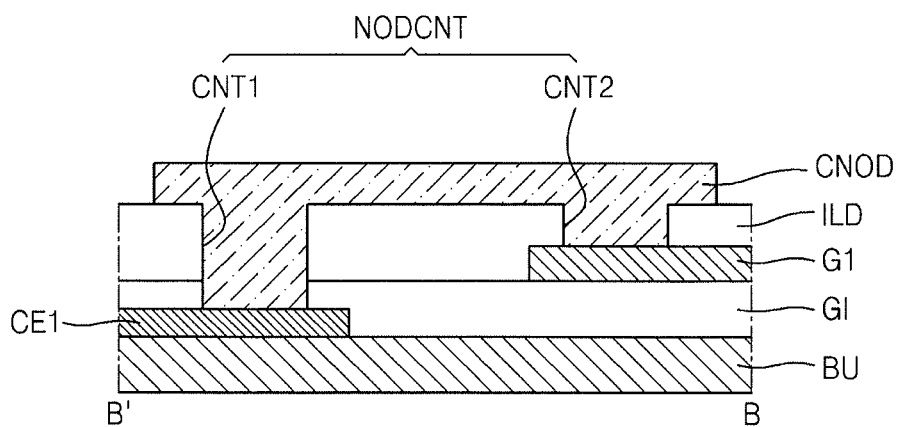
FIG. 6 is a schematic cross-sectional view of a part B-B' of FIG. 5.

The organic light-emitting display device in FIG. 5 will now be described. FIG. 5 is a schematic cross-sectional view of a pixel 100_C of an organic light-emitting display device. FIG. 6 is a schematic cross-sectional view of a part B-B' of FIG. 5.

Referring to FIGS. 5 and 6, the pixel 100_C of the organic light-emitting display device includes the two TFTs T1 and T2 and the one capacitor C1 like the first exemplary embodiment. A difference in the node contact hole NODCNT will now be described.

The first capacitor electrode CE1 of the first capacitor C1 and the first gate electrode G1 of the first TFT T1 do not overlap and are separated from each other.

The first capacitor electrode CE1 of the first capacitor C1 is connected to the connection node CNOD through the first contact hole CNT1 formed in the gate insulation layer G1 and the interlayer insulation layer ILD.

The gate insulation layer G1 is formed between the first active layer A1 and the first gate electrode G1 of the first TFT T1. The interlayer insulation layer ILD is formed between the first gate electrode G1 and the connection node CNOD. The first gate electrode G1 is connected to the connection node CNOD through the second contact hole CNT2 formed in the interlayer insulation layer ILD.

In this regard, the first contact hole CNT1 and the second contact hole CNT2 are not united into one contact hole like the above-described first exemplary embodiment, but a bank is formed between the first contact hole CNT1 and the second contact hole CNT2 by the first gate electrode G1 and the interlayer insulation layer ILD so that a space of the node contact hole NODCNT is separated by the bank. Thus, a design margin needs to be allocated to form an insulation layer as the bank between the first contact hole CNT1 and the second contact hole CNT2, a space utilization is restricted when a pixel is designed. A large area of a capacitor is not designed due to such space restriction, which may be disadvantageous to a high resolution pixel design.

Figure 7:
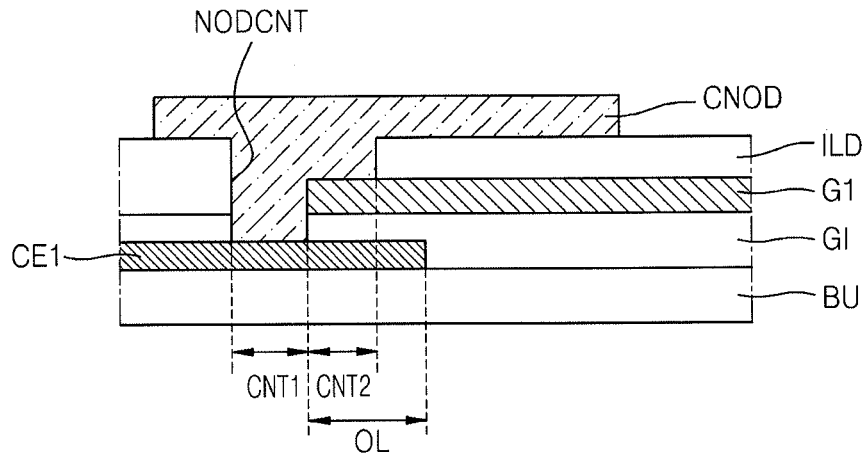
FIG. 7 is a schematic cross-sectional view of an organic light-emitting display device.

An organic light-emitting display device of FIG. 7 will now be described. The organic light-emitting display device in FIG. 7 is the same as that of the first exemplary embodiment in that the first capacitor electrode CE1 of the first capacitor C1 and the first gate electrode G1 of the first TFT T1 are connected to the connection node CNOD through the integrally formed node contact hole NODCNT without a bank formed of the gate insulation layer G1 or the interlayer insulation layer ILD. However, the organic light-emitting display device in FIG. 7 is different from that of the first exemplary embodiment in that no through hole is formed.

Therefore, the node contact hole NODCNT of the organic light-emitting display device in FIG. 7 is not separated by an insulation layer but is integrally formed, which reduces a design margin for forming the bank by the insulation layer when a pixel is designed, thereby maximizing a space utilization. However, since a through hole is not formed, a contact failure may occur due to a processing error or misalignment that occurs when the node contact hole NODCNT is formed.

Figure 8A:
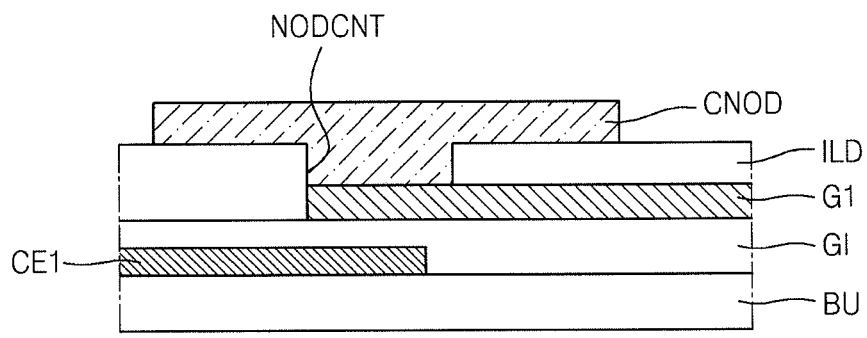
FIGS. 8A and 8B illustrate contact failures of the organic light-emitting display device in FIG. 7.
Figure 8B:
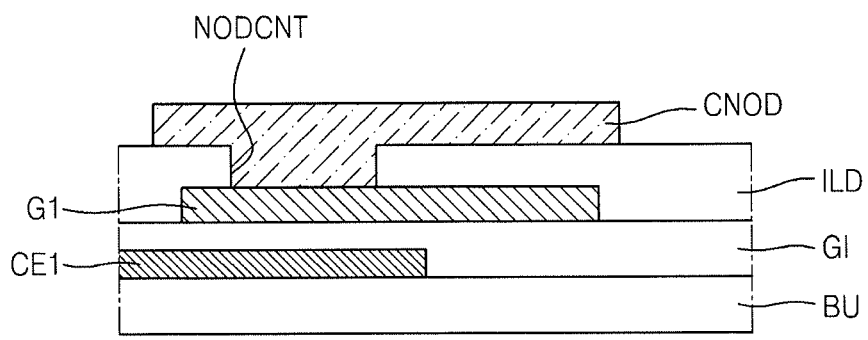

FIGS. 8A and 8B illustrate possible contact failures of the organic light-emitting display device in FIG. 7.

Referring to FIG. 8A, a misalignment of the node contact hole NDOCNT occurs so that a location in which the node contact hole NDOCNT is formed is shifted right, compared to FIG. 7. Due to such shifting, the node contact hole NDOCNT is formed only on, e.g., in contract with, the first gate electrode G1 that is an upper layer and is not formed on, e.g., in contact with, the first capacitor electrode CE1 that is a lower layer. Thus, a contact failure in which the connection node CNOD is connected to only the first gate electrode G1 occurs.

Referring to FIG. 8B, a misalignment of the first gate electrode G1 occurs so that a location in which the first gate electrode G1 is formed is shifted left, compared to FIG. 7. Due to such shifting, the node contact hole NDOCNT is formed only on, e.g., in contact with, the first gate electrode G1 that is the upper layer and is not formed on, e.g., in contact with, the first capacitor electrode CE1 that is the lower layer. Thus, a contact failure in which the connection node CNOD is connected to only the first gate electrode G1 occurs.

Figure 9A:
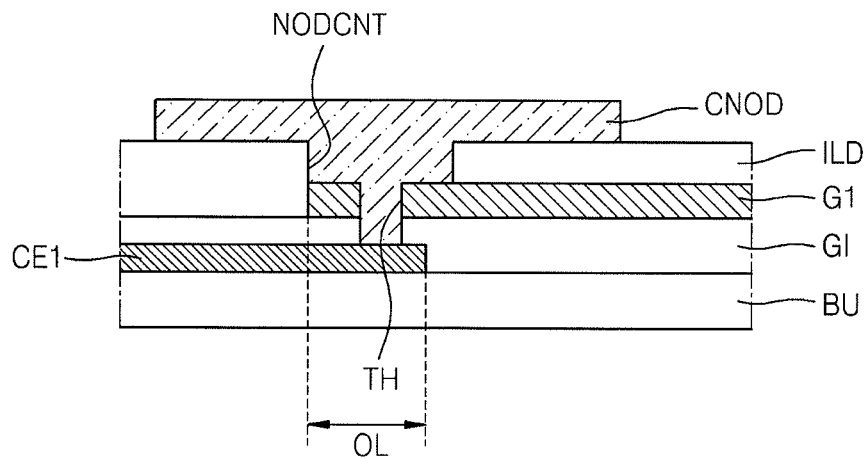
FIGS. 9A and 9B illustrate examples of an improved contact in an organic light-emitting display device.
Figure 9B:
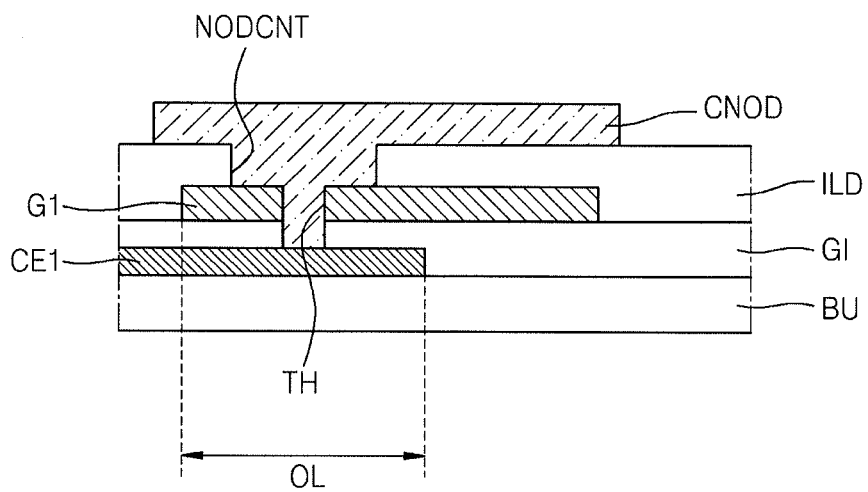

FIGS. 9A and 9B illustrate examples of an improved contact in an organic light-emitting display device.

Referring to FIG. 9A, the through hole TH of the first gate electrode G1 is formed in the region OL in which the first capacitor CE1 and the first gate electrode G1 overlap. Like the organic light-emitting display device of FIG. 8A, in a case where a misalignment of the node contact hole NDOCNT occurs so that a location in which the node contact hole NDOCNT is formed is shifted right, the node contact hole NDOCNT may be connected to the first capacitor electrode CE1 that is a lower layer through the through hole TH. Thus, the connection node CNOD is connected to both the first gate electrode G1 and the first capacitor electrode CE1, thereby improving the contact.

Referring to FIG. 9B, the through hole TH of the first gate electrode G1 is formed in the region OL in which the first capacitor CE1 and the first gate electrode G1 overlap. Like the organic light-emitting display device of FIG. 8B, in a case where a misalignment of the first gate electrode G1 occurs so that a location in which the first gate electrode G1 is formed is shifted left, the node contact hole NDOCNT may be connected to the first capacitor electrode CE1 that is the lower layer through the through hole TH. Thus, the connection node CNOD is connected to both the first gate electrode G1 and the first capacitor electrode CE1, thereby improving the contact.

An organic light-emitting display device according to a second exemplary embodiment will now be described with reference to FIGS. 10 through 13.

Figure 10:
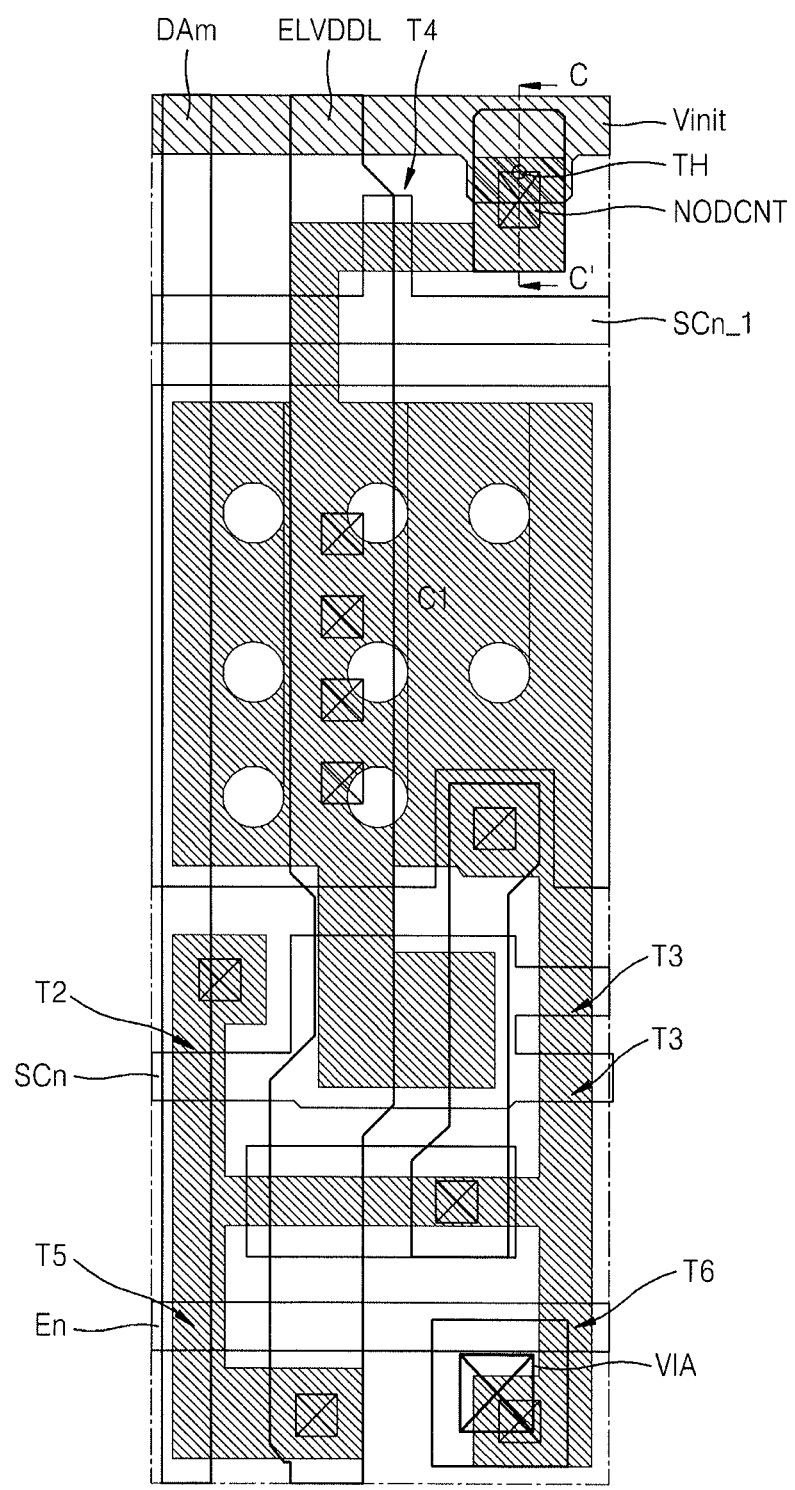
FIG. 10 is a schematic cross-sectional view of a pixel of an organic light-emitting display device according to an exemplary embodiment.
Figure 11:
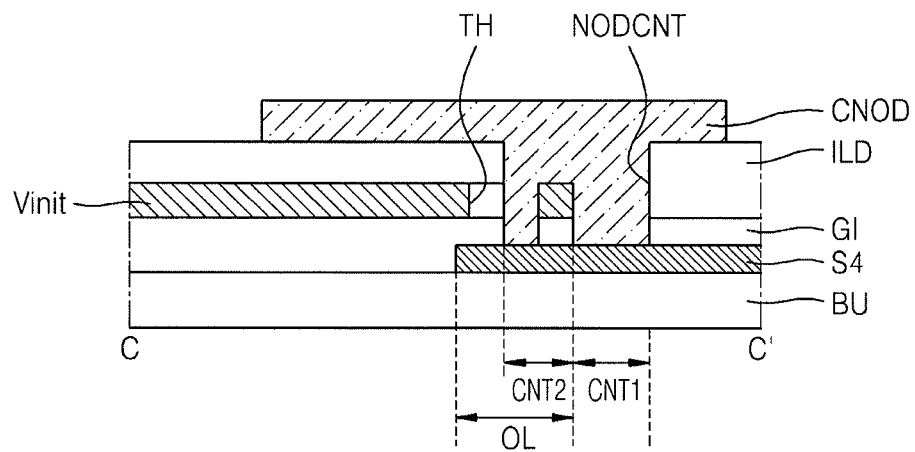
FIG. 11 is a schematic cross-sectional view of a part C-C' of FIG. 10.
Figure 12:
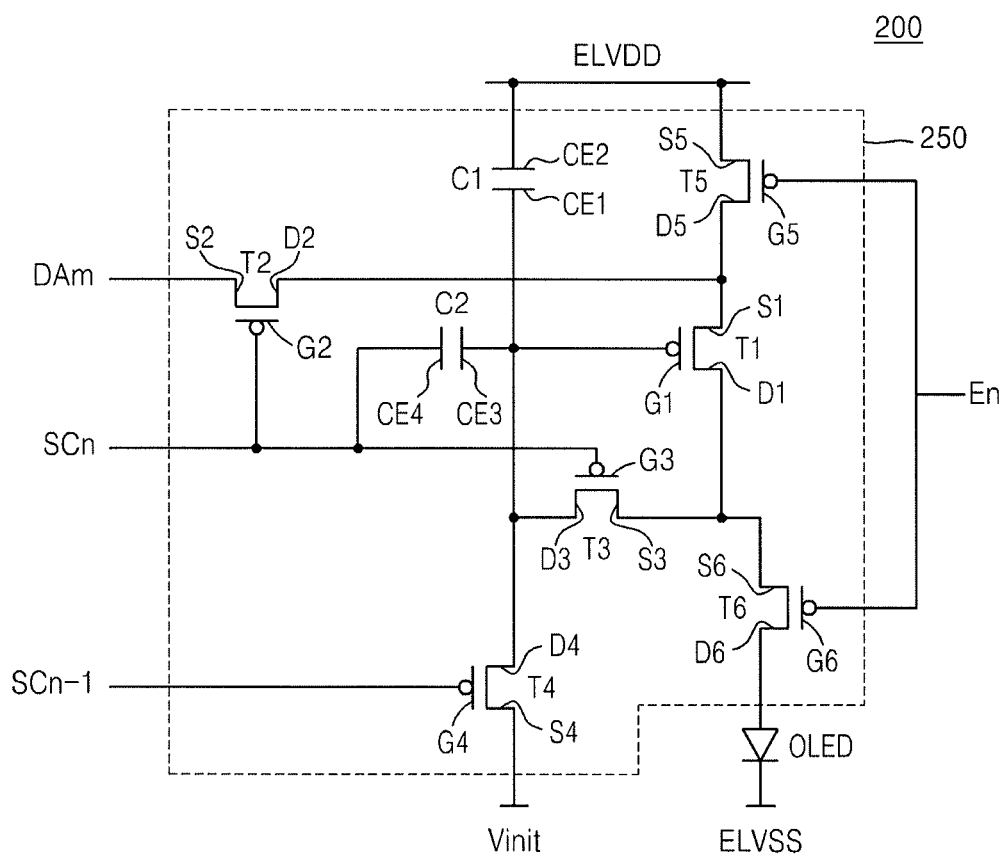
FIG. 12 is a circuit diagram of the pixel of FIG. 10.
Figure 13:
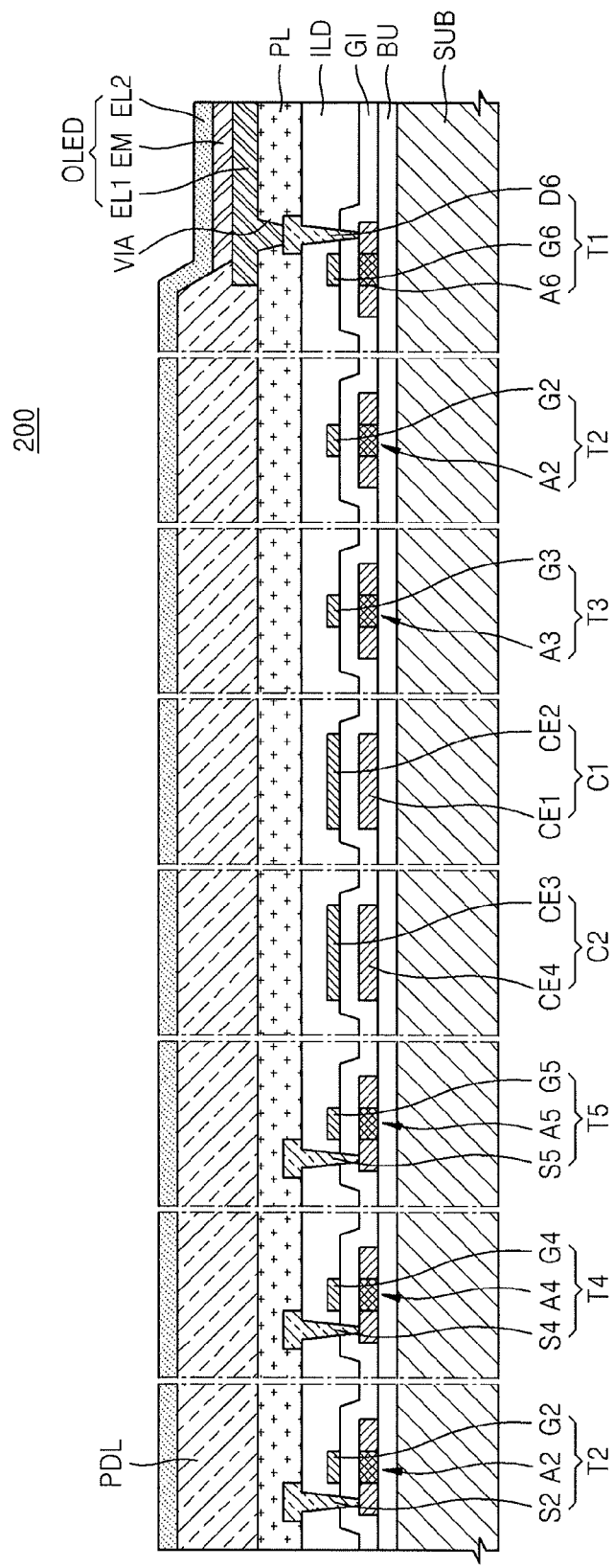
FIG. 13 is a cross-sectional diagram of the pixel of FIG. 10.

FIG. 10 is a schematic cross-sectional view of a pixel 200 of an organic light-emitting display device according to a second exemplary embodiment. FIG. 11 is a schematic cross-sectional view of a part C-C' of FIG. 7. FIG. 12 is a circuit diagram of the pixel 200 of FIG. 10. FIG. 13 is a cross-sectional diagram of the pixel 200 of FIG. 10.

Referring to FIGS. 10 through 13, the pixel 200 of the organic light-emitting display device according to an exemplary embodiment includes six TFTs and two capacitors.

A pixel circuit 250 includes the first TFT T1, the second TFT T2, a third TFT T3, a fourth TFT T4, a fifth TFT T5, a sixth TFT T6, the first capacitor C1, and the second capacitor C2.

The first TFT T1 is connected between the driving power line ELVDDL and the OLED and supplies the driving power corresponding to a data signal from the first power source ELVDD to the OLED during a light emitting period of the pixel 200. That is, the first TFT T1 functions as a driving transistor of the pixel 200. The first TFT T1 includes the first active layer A1, the first gate electrode G1, the first source electrode S1, and the first drain electrode D1.

The first active layer A1 may include polysilicon, a source region and a drain region that are doped with a doping material, and a channel region disposed between the source region and the drain region. The first active layer A1 is disposed between the buffer layer BU and the gate insulation layer G1 that are formed in a substrate SUB.

The first gate electrode G1 is connected to the first capacitor electrode CE1 of the first capacitor C1, and is disposed on the same layer as the first scan line SCn, a second scan line SCn−1, and an initialization power line Vinit.

The first source electrode S1 is connected to the driving power line ELVDDL via the fifth TFT T5.

The first drain electrode D1 is connected to the OLED via the sixth TFT T6.

The second TFT T2 is connected between the data line DAm and the first TFT T1, and transfers a data signal provided from the data line DAm to the inside of the pixel 200 when a scan signal is provided from the second scan line SCn−1. That is, the second TFT T2 functions as a switching transistor of the pixel 200. The second TFT T2 includes the second active layer A2, the second gate electrode G2, the second source electrode S2, and the second drain electrode D2.

The second active layer A2 may include polysilicon, a source region and a drain region that are doped with a doping material, and a channel region disposed between the source region and the drain region. The second active layer A2 is disposed between the buffer layer BU and the gate insulation layer G1 that are formed in the substrate SUB.

The second gate electrode G2 is connected to the first scan line SCn.

The second source electrode S2 is connected to the data line DAm.

The second drain electrode D2 is connected to the first source electrode S1 of the first TFT T1.

The third TFT T3 is connected between the first drain electrode D1 and the first gate electrode G1 of the first TFT T1, and compensates for a threshold voltage of the first TFT T1 by connecting the first TFT T1 in diode form when the data signal is provided to the inside of the pixel 200. That is, the third TFT T3 functions as a compensation transistor of the pixel 200. The third TFT T3 includes the third active layer A3, the third gate electrode G3, the third source electrode S3, and the third drain electrode D3.

The third active layer A3 may include polysilicon, a source region, and a drain region that are doped with a doping material, and a channel region disposed between the source region and the drain region. The third active layer A3 is disposed between the buffer layer BU and the gate insulation layer G1 that are formed in the substrate SUB.

The third gate electrode G3 is connected to the first scan line SCn.

The third source electrode S3 is connected to the first drain electrode D1 of the first TFT T1.

The third drain electrode D3 is connected to the first gate electrode G1 of the first TFT T1.

The fourth TFT T4 is connected between the initialization power line Vinit and the first gate electrode G1 of the first TFT T1, transfers initialization power supplied from the initialization power line Vinit to the inside of the pixel 200 when the scan signal is provided from the second scan line SCn−1 during an initialization period before a data programming period in which the data signal is input into the pixel 200 so that the data signal may be smoothly provided to the inside of the pixel 200 during the data programming period, and initializes the first TFT T1. That is, the fourth TFT T4 functions as a switching transistor of the pixel 200. The fourth TFT T4 includes the fourth active layer A4, the fourth gate electrode G4, the fourth source electrode S4, and the fourth drain electrode D4.

The fourth active layer A4 may include polysilicon, a source region and a drain region that are doped with a doping material, and a channel region disposed between the source region and the drain region. The fourth active layer A4 is disposed between the buffer layer BU and the gate insulation layer G1 that are formed in the substrate SUB.

The fourth gate electrode G4 is connected to the second scan line SCn−1.

The fourth source electrode S4 includes the region OL that overlaps with the initialization power line Vinit. The through hole TH is formed in the region OL. The fourth source electrode S4 is connected to the initialization power line Vinit through the connection node CNOD formed in the through hole TH and the node contact hole NODCNT. The fourth source electrode S4 is disposed on the same layer as the first through sixth active layers A1 through A6. That is, the fourth source electrode S4 may be formed of polysilicon doped with a doping material.

The fourth drain electrode D4 is connected to the first gate electrode G1 of the first TFT T1.

The fifth TFT T5 is connected between the driving power line ELVDDL and the first TFT T1, blocks a connection between the first power ELVDD and the first TFT T1 during a non-emissive period of the pixel 200, and connects between the first power ELVDD and the first TFT T1 during an emissive period of the pixel 200. That is, the fifth TFT T5 functions as a switching transistor of the pixel 200. The fifth TFT T5 includes the fifth active layer A5, the fifth gate electrode G5, the fifth source electrode S5, and the fifth drain electrode D5.

The fifth active layer A5 may include polysilicon, a source region and a drain region that are doped with a doping material, and a channel region disposed between the source region and the drain region. The fifth active layer A5 is disposed between the buffer layer BU and the gate insulation layer G1 that are formed in the substrate SUB.

The fifth gate electrode G5 is connected to an emissive control line En.

The fifth source electrode S5 is connected to the driving power line ELVDDL.

The fifth drain electrode D5 is connected to the first source electrode S1 of the first TFT T1.

The sixth TFT T6 is connected between the first TFT T1 and the OLED, blocks a connection between the first TFT T1 and the OLED during the non-emissive period of the pixel 200, and connects between the f first TFT T1 and the OLED during the emissive period of the pixel 200. That is, the sixth TFT T6 functions as a switching transistor of the pixel 200. The sixth TFT T6 includes the sixth active layer A6, the sixth gate electrode G6, the sixth source electrode S6, and the sixth drain electrode D6.

The sixth active layer A6 may include polysilicon, a source region and a drain region that are doped with a doping material, and a channel region disposed between the source region and the drain region. The sixth active layer A6 is disposed between the buffer layer BU and the gate insulation layer G1 that are formed in the substrate SUB.

The sixth gate electrode G6 is connected to the emissive control line En.

The sixth source electrode S6 is connected to the first drain electrode D1 of the first TFT T1.

The sixth drain electrode D6 is connected to an anode electrode of the OLED.

Although the second source electrode S2 of the second TFT T2, the fourth source electrode S4 of the fourth TFT T4, and the fifth source electrode S5 of the fifth TFT T5 of the organic light-emitting display device according to the second exemplary embodiment are formed in different layers from the second active layer A2, the fourth active layer A4, and the fifth active layer A5, respectively, in FIG. 10, this does not mean that the second source electrode S2, the fourth source electrode S4, and the fifth source electrode S5 are not selectively formed in the same layers as the second active layer A2, the fourth active layer A4, and the fifth active layer A5, respectively. For example, the second source electrode S2, the fourth source electrode S4, and the fifth source electrode S5 may be selectively formed in the same layers as the second active layer A2, the fourth active layer A4, and the fifth active layer A5, respectively.

In FIG. 10, when the second source electrode S2, the fourth source electrode S4, and the fifth source electrode S5 that are selectively formed in the same layers as the second active layer A2, the fourth active layer A4, and the fifth active layer A5, respectively, are connected to conductive layers formed in layers different from the second active layer A2, the fourth active layer A4, and the fifth active layer A5 through predetermined contact holes, the conductive layers may indicate the second source electrode S2, the fourth source electrode S4, and the fifth source electrode S5. For example, referring to FIG. 11, although the fourth source electrode S4 is formed in the same layer as the fourth active layer A4 and is connected to the connection node CNOD formed in a layer different from the fourth active layer A4 through the node contact hole NODCNT, a part of the connection node CNOD indicates the fourth source electrode S4 in FIG. 13 since the connection node CNOD and the fourth source electrode S4 formed in the fourth active layer A4 are electrically and functionally identical to each other.

The first capacitor C1 is used to store the data signal provided to the inside of the pixel 200 during a data programming period and maintain the data signal for a frame and is connected between the driving power line ELVDDL connected to the first power ELVDD and the first gate electrode G1 of the first TFT T1 connected to the initialization power line Vinit. That is, the first capacitor C1 functions as a storage capacitor. The first capacitor C1 includes the first capacitor electrode CE1 and the second capacitor electrode CE2.

The first capacitor electrode CE1 is connected to the first gate electrode G1 of the first TFT T1 connected to the initialization power line Vinit.

The second capacitor electrode CE2 is connected to the driving power line ELVDDL.

The second capacitor C2 is used to compensate for a voltage drop due to a load in the organic light-emitting display device and is connected between the first capacitor electrode CE1 of the first capacitor C1 and the first scan line SCn. That is, when a voltage level of a current scan signal changes, in particular, at the time when the current scan signal is stopped being provided, the second capacitor C2 functions as a boosting capacitor that compensates for the voltage drop due to the load in the organic light-emitting display device by increasing a voltage of the first gate electrode G1 of the first TFT T1 owing to a coupling function. The second capacitor C2 includes a third capacitor electrode CE3 and a fourth capacitor electrode CE4.

The third capacitor electrode CE3 is connected to the first capacitor electrode CE1 of the first capacitor C1.

The fourth capacitor electrode CE4 is connected to the first scan line SCn.

The OLED is connected to the sixth drain electrode D6 of the sixth TFT T6 through the via hole VIA.

The OLED includes the anode electrode EL1 disposed on the sixth drain electrode D6 with a planarization layer PL interposed therebetween and connected to the sixth drain electrode D6, the emissive layer EL, and the cathode electrode E2 connected to the second power source ELVSS. A location of the emissive layer EL may be determined by the pixel definition layer PDL. The cathode electrode EL2 may be disposed throughout the pixel definition layer PDL.

Referring to FIGS. 10 and 11, the gate insulation layer G1 is formed between the initialization power line Vinit and the fourth source electrode S4 of the fourth TFT T4, and the interlayer insulation layer ILD is formed between the initialization power line Vinit and the connection node CNOD.

The initialization power line Vinit is connected to the connection node CNOD through the first contact hole CNT1 formed in the interlayer insulation layer ILD. The fourth source electrode S4 is connected to the connection node CNOD through the second contact hole CNT2 formed in the gate insulation layer G1 and the interlayer insulation layer ILD. In addition, the fourth source electrode S4 is connected to the connection node CNOD through the through hole TH formed in the initialization power line Vinit. That is, although the initialization power line Vinit and the fourth source electrode S4 are formed in different layers, they are connected to the same connection node CNOD through the through hole TH and the node contact hole NODCNT.

In this regard, the first contact hole CNT1 and the second contact hole CNT2 are not separated from each other by the gate insulation layer G1 or the interlayer insulation layer ILD but form the one united node contact hole NODCNT. That is, the node contact hole NODCNT is integrally formed without a bank by the gate insulation layer G1 or the interlayer insulation layer ILD.

The initialization power line Vinit and the fourth source electrode S4 include the partially overlapping region OL in a region where the node contact hole NODCNT is formed. The interlayer insulation layer ILD is not formed in the partially overlapping region OL. The node contact hole NODCNT and the through hole TH partially overlap and are formed in the initialization power line Vinit of the partially overlapping region OL.

If the first contact hole CNT1 and the second contact hole CNT2 are separated to form the node contact hole NODCNT, an insulation layer needs to be formed as a bank between the first contact hole CNT1 and the second contact hole CNT2. However, since the first contact hole CNT1 and the second contact hole CNT2 are not separated from each other but are integrally formed, no bank is necessarily formed between the first contact hole CNT1 and the second contact hole CNT2, which reduces a design margin for forming the bank when a pixel is designed, thereby maximizing a space utilization. Such reduced space may be used to increase an area of a capacitor, thereby implementing a high resolution pixel design.

Even when the first contact hole CNT1 and the second contact hole CNT2 are not separated from each other but are integrally formed, a contact failure may occur between the initialization power line Vinit and the fourth source electrode S4 due to a processing error or misalignment that occurs when the initialization power line Vinit and the node contact hole NODCNT are formed. However, although the processing error or misalignment occurs when the initialization power line Vinit or the node contact hole NODCNT is formed by forming the through hole TH in the initialization power line Vinit in the present embodiment, since the initialization power line Vinit and the fourth source electrode S4 are connected to each other through the through hole TH, the contact may be improved.

Although the integrated node contact hole NODCNT is formed between the first gate electrode G1 and the first capacitor electrode CE1 in the above-described first embodiment, and the integrated node contact hole NODCNT is formed between the fourth source electrode S4 and the initialization power line Vinit in the above-described second embodiment, these are parts of the embodiments and the embodiments are not limited thereto. Thus, embodiments may be applied in a case where conductive layers formed in different layers are connected through an integrated contact hole as described in the above embodiments between adjacent devices or wires.

Embodiments relate to a thin-film transistor array substrate and a display device including the thin-film transistor array substrate. For example, embodiments relate to a thin-film transistor array substrate and a display device including the thin-film transistor array substrate having an efficient space arrangement and connection structure.

According to a thin-film transistor array substrate and a display device including the thin-film transistor array substrate of described above, a node contact hole is not separated by an insulation layer but is integrally formed. Accordingly, a reduction in a design margin compared to a node contact hole that is separately formed may be realized, thereby maximizing a space utilization and achieving a high resolution pixel design.

Further, a through hole may be formed in a region where a first conductive layer and a second conductive layer overlap. Accordingly, the first conductive layer and the second conductive layer may be connected through the through hole even when a processing error or misalignment may occur when the first conductive layer, the second conductive layer, or the node contact hole is formed, thereby improving a contact.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A thin-film transistor (TFT) array substrate, comprising:
   a first conductive layer that is one of an active layer, a gate electrode, a source electrode, and a drain electrode in a TFT;
   a second conductive layer that partially overlaps the first conductive layer and that is in a layer different from the first conductive layer;
   a through hole in a layer between the first conductive layer and the second conductive layer in a region in which the first conductive layer and the second conductive layer overlap each other;
   a node contact hole integrally formed to include a first contact hole in the first conductive layer and a second contact hole in the second conductive layer such that the first contact hole is continuous with the second contact hole and is not separated from the second contact hole by an insulation layer; and
   a connection node that is in another layer different from the first conductive layer and the second conductive layer, and that is connected to the first conductive layer and the second conductive layer through the through hole and the node contact hole.

2. The TFT array substrate of claim 1, wherein the through hole and the node contact hole at least partially overlap each other.

3. The TFT array substrate of claim 1, wherein a size of the through hole is smaller than a size of the node contact hole.

4. The TFT array substrate of claim 1, wherein no bank is formed by the insulation layer between the first contact hole and the second contact hole.

5. The TFT array substrate of claim 1, wherein one of the first conductive layer and the second conductive layer is formed in the same layer as the active layer.

6. The TFT array substrate of claim 5, wherein one of the first conductive layer and the second conductive layer is formed of a same material as the active layer.

7. The TFT array substrate of claim 1, wherein the insulation layer includes a first insulation layer between the first conductive layer and the second conductive layer, and includes a second insulation layer between the connection node and an upper one of the first conductive layer and the second conductive layer.

8. The TFT array substrate of claim 7, wherein the second insulation layer is not formed in a region in which the node contact hole is formed and the first conductive layer and the second conductive layer partially overlap each other.

9. A display apparatus, comprising:
   a plurality of pixels includes at least one thin film transistor (TFT) and at least one capacitor, a pixel circuit is connected to a plurality of wires, and a display device is connected to the pixel circuit;
   a first conductive layer in the plurality of pixels, the first conductive layer is one of an active layer, a gate electrode, a source electrode, and a drain electrode included in the at least one TFT;
   a second conductive layer in the plurality of pixels, the second conductive layer partially overlapping the first conductive layer and being in a layer different from the first conductive layer;
   a through hole in a layer between the first conductive layer and the second conductive layer in a region in which the first conductive layer and the second conductive layer overlap each other;
   a node contact hole integrally formed to include a first contact hole in the first conductive layer and a second contact hole in the second conductive layer such that the first contact hole is continuous with the second contact hole and is not separated from the second contact hole by an insulation layer; and
   a connection node that is in another layer different from the first conductive layer and the second conductive layer, and that is connected to the first conductive layer and the second conductive layer through the through hole and the node contact hole.

10. The display apparatus of claim 9, wherein the through hole and the node contact hole at least partially overlap each other.

11. The display apparatus of claim 9, wherein a size of the through hole is smaller than a size of the node contact hole.

12. The display apparatus of claim 9, wherein no bank is formed by the insulation layer between the first contact hole and the second contact hole.

13. The display apparatus of claim 9, wherein the second conductive layer is an electrode of the capacitor.

14. The display apparatus of claim 9, wherein the second conductive layer is a layer extending from the plurality of wires.

15. The display apparatus of claim 9, wherein the connection node is on a same layer as a data wire among the plurality of wires that provides the pixel circuit with a data signal.

16. The display apparatus of claim 9, wherein one of the first conductive layer and the second conductive layer is in a same layer as the active layer.

17. The display apparatus of claim 16, wherein one of the first conductive layer and the second conductive layer is formed of a same material as the active layer.

18. The display apparatus of claim 17, wherein one of the first conductive layer and the second conductive layer includes doped polysilicon.

19. The display apparatus of claim 9, wherein the insulation layer includes a first insulation layer between the first conductive layer and the second conductive layer, and a second insulation layer between the connection node and an upper one of the first conductive layer and the second conductive layer.

20. The display apparatus of claim 19, wherein the second insulation layer is not formed in a region in which the node contact hole is formed and the first conductive layer and the second conductive layer partially overlap each other.

21. The display apparatus of claim 19, wherein the display device is an organic light-emitting device (OLED) that includes a first electrode, a second electrode, and an emissive layer between the first electrode and the second electrode.

22. The display apparatus of claim 21, wherein a planarization layer is between the OLED and the connection node.

23. A display apparatus, comprising:
   a plurality of pixels includes at least one thin film transistor (TFT) and at least one capacitor, a pixel circuit is connected to a plurality of wires, and a display device is connected to the pixel circuit;
   a first conductive layer is in the plurality of pixels;
   a second conductive layer is in the plurality of pixels, the second conductive layer partially overlapping the first conductive layer and being in a layer different from the first conductive layer;
   a through hole in a layer between the first conductive layer and the second conductive layer in a region in which the first conductive layer and the second conductive layer overlap each other;
   a node contact hole integrally formed to include a first contact hole in the first conductive layer and a second contact hole in the second conductive layer such that the first contact hole is continuous with the second contact hole and is not separated from the second contact hole by an insulation layer; and
   a connection node that is in another layer different from the first conductive layer and the second conductive layer, and that is connected to the first conductive layer and the second conductive layer through the through hole and the node contact hole.

24. The display apparatus of claim 23, wherein the first conductive layer is one of an active layer, a gate electrode, a source electrode, and a drain electrode included in the at least one TFT.

25. The display apparatus of claim 23, wherein the through hole and the node contact hole at least partially overlap each other.

26. The display apparatus of claim 23, wherein a size of the through hole is smaller than a size of the node contact hole.

27. The display apparatus of claim 23, wherein the display device is an OLED that includes a first electrode, a second electrode, and an emissive layer between the first electrode and the second electrode.

28. The display apparatus of claim 27, wherein a planarization layer is between the OLED and the connection node.

* * * * *